(12) United States Patent
Weng et al.

(10) Patent No.: US 9,012,296 B2
(45) Date of Patent: Apr. 21, 2015

(54) SELF-ALIGNED DEEP TRENCH CAPACITOR, AND METHOD FOR MAKING THE SAME

(71) Applicant: Taiwan Semiconductor Manufacturing Co., Ltd., Hsin-Chu (TW)

(72) Inventors: Wu-An Weng, Hsinchu (TW); Chen-Chien Chang, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 82 days.

(21) Appl. No.: 13/710,537

(22) Filed: Dec. 11, 2012

(65) Prior Publication Data

US 2014/0159197 A1    Jun. 12, 2014

(51) Int. Cl.
*H01L 21/20*      (2006.01)
*H01L 49/02*      (2006.01)

(52) U.S. Cl.
CPC ...................... *H01L 28/92* (2013.01)

(58) Field of Classification Search
CPC .............. H01L 29/945; H01L 27/1087; H01L 21/76205
USPC .................... 438/387, 389; 257/534
See application file for complete search history.

(56) References Cited

U.S. PATENT DOCUMENTS

| | | | | |
|---|---|---|---|---|
| 4,859,622 | A * | 8/1989 | Eguchi | 438/389 |
| 5,066,608 | A * | 11/1991 | Kim et al. | 438/244 |
| 5,285,093 | A | 2/1994 | Lage et al. | |
| 5,394,000 | A * | 2/1995 | Ellul et al. | 257/301 |
| 5,776,808 | A * | 7/1998 | Muller et al. | 438/243 |
| 5,798,545 | A * | 8/1998 | Iwasa et al. | 257/301 |
| 5,976,928 | A * | 11/1999 | Kirlin et al. | 438/240 |
| 6,245,640 | B1 * | 6/2001 | Claussen et al. | 438/424 |
| 6,626,968 | B2 * | 9/2003 | Park et al. | 51/309 |
| 6,825,078 | B1 | 11/2004 | Huang | |
| 6,825,128 | B2 | 11/2004 | Masuda | |
| 6,828,213 | B2 | 12/2004 | Mehrad et al. | |
| 6,828,248 | B1 | 12/2004 | Tao et al. | |
| 6,933,551 | B1 * | 8/2005 | Stribley et al. | 257/296 |
| 7,078,291 | B2 | 7/2006 | Hsu | |
| 7,122,437 | B2 | 10/2006 | Dyer et al. | |
| 7,344,954 | B2 | 3/2008 | Yeh et al. | |
| 7,575,970 | B2 | 8/2009 | Ho et al. | |
| 7,759,214 | B2 | 7/2010 | Yoon | |
| 2008/0090373 | A1 * | 4/2008 | Lee | 438/386 |
| 2008/0213967 | A1 | 9/2008 | Su et al. | |
| 2008/0291601 | A1 * | 11/2008 | Roozeboom et al. | 361/306.2 |
| 2012/0104551 | A1 | 5/2012 | Kemerer et al. | |

OTHER PUBLICATIONS

Official Action issued Apr. 15, 2014 in counterpart Korean Patent Application No. 10-2013-0063847.

* cited by examiner

*Primary Examiner* — Caridad Everhart
(74) *Attorney, Agent, or Firm* — Duane Morris LLP

(57) ABSTRACT

A method for forming a trench capacitor includes providing a substrate of a semiconductor material having a hard mask layer; etching the hard mask layer and the substrate to form at least one trench extending into the substrate; and performing pull-back etching on the hard mask layer. In the pull-back etching, a portion of the hard mask layer defining and adjacent to side walls of an opening of the at least one trench is removed. A resulting opening on the hard mask layer has a width dimension larger than a width dimension of an opening of the at least one trench extending into the substrate. The method further comprises doping the semiconductor material defining upper surfaces and sidewalls of the at least one trench to form a doped well region.

18 Claims, 10 Drawing Sheets

SELF-ALIGNED DEEP TRENCH CAPACITOR, AND METHOD FOR MAKING THE SAME

FIELD

The disclosed method and devices relate to semiconductors. More particularly, the disclosed subject matter relates to a method for making a trench capacitor of a semiconductor device, and resulting device comprising a trench capacitor.

BACKGROUND

In integrated circuit (IC) design, many applications exist for high-performance, on-chip capacitors. These applications include dynamic random access memories (DRAM), voltage controlled oscillators, phase-locked loops, operational amplifiers, and switching capacitors. Such on-chip capacitors can also be used to decouple digital and analog integrated circuits from the noise of the rest of the electrical system.

Capacitor structures for ICs have evolved from the initial parallel plate capacitor structures comprised of two conductive layers separated by a dielectric to different capacitor designs to meet specifications for high capacitance in increasingly smaller devices. These designs may include trench capacitors, metal-oxide-metal (MOM) capacitor designs and interdigitated finger MOM capacitor structures, for example. For example, in a DRAM device, the capacitors can be deep trench capacitors disposed inside a semiconductor substrate, or stack capacitors stacked on a semiconductor substrate.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions of the various features are arbitrarily expanded or reduced for clarity. Like reference numerals denote like features throughout specification and drawings.

DETAILED DESCRIPTION

Figure 1:
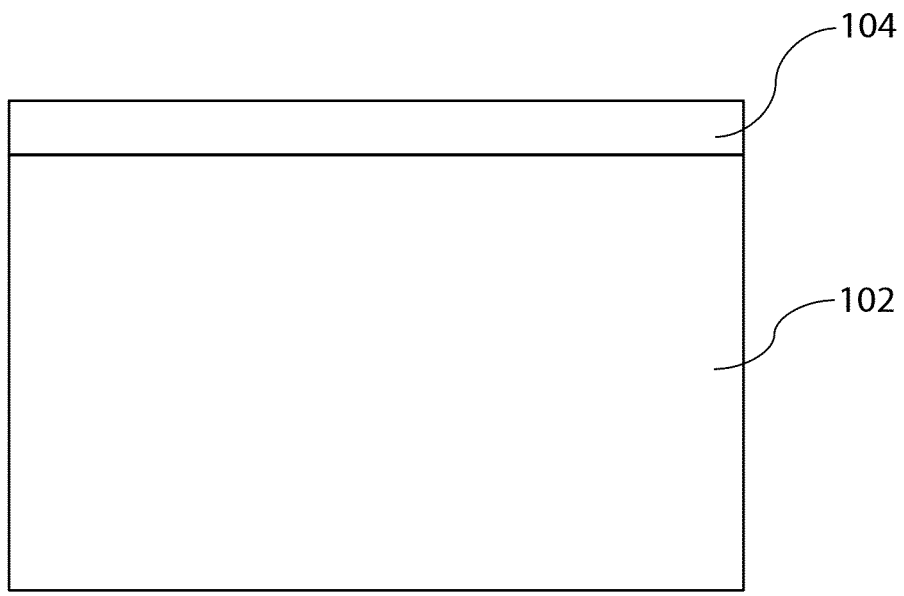
FIGS. 1-10 illustrate a method for forming a trench capacitor in accordance with some embodiments.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Semiconductor devices such as DRAM devices continue to be scaled to smaller sizes to meet advanced performance targets. Fabrication of devices with such small dimensions involves precise control. For example, a method for forming a trench capacitor such as a deep trench capacitor generally includes multiple steps of etching, deposition, and patterning to provide a capacitor or a capacitor array. An increasing number of trench capacitors are fabricated in a limited space of a semiconductor substrate to provide high capacitance density. Meanwhile, the trench capacitors should be in good alignment with other device portions.

The present disclosure provides a method for forming a trench capacitor such as deep trench capacitor, and a trench capacitor of a semiconductor device formed by the method. In some embodiments, the method for forming a trench capacitor comprises providing a substrate comprising a semiconductor material and having a hard mask layer over the substrate; etching the hard mask layer and the substrate to form at least one trench extending into the substrate; and performing pull-back etching on the hard mask layer as described herein.

Examples of a trench capacitor include but are not limited to a deep trench capacitor. In FIGS. 1-10, like items are indicated by like reference numerals, and for brevity, descriptions of the structure, provided above with reference to the previous figures, are not repeated. The methods described in FIGS. 14 and 15 are described with reference to the exemplary structure described in FIGS. 1-10.

Figure 14:
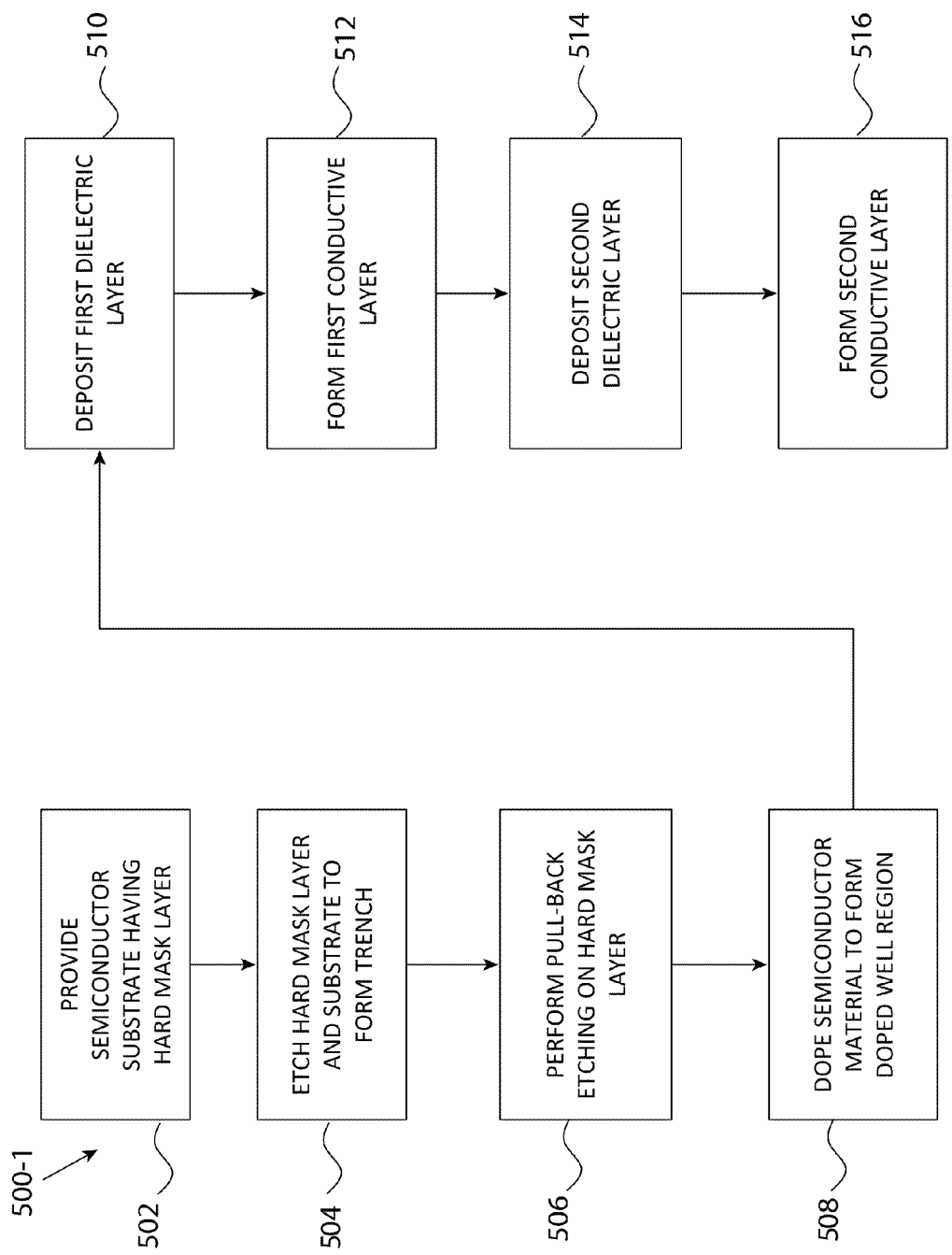
FIGS. 14 and 15 are flow charts illustrating an exemplary method for forming a trench capacitor in accordance with some embodiments. The structures after each or several steps are shown in FIGS. 1-10.
Figure 15:
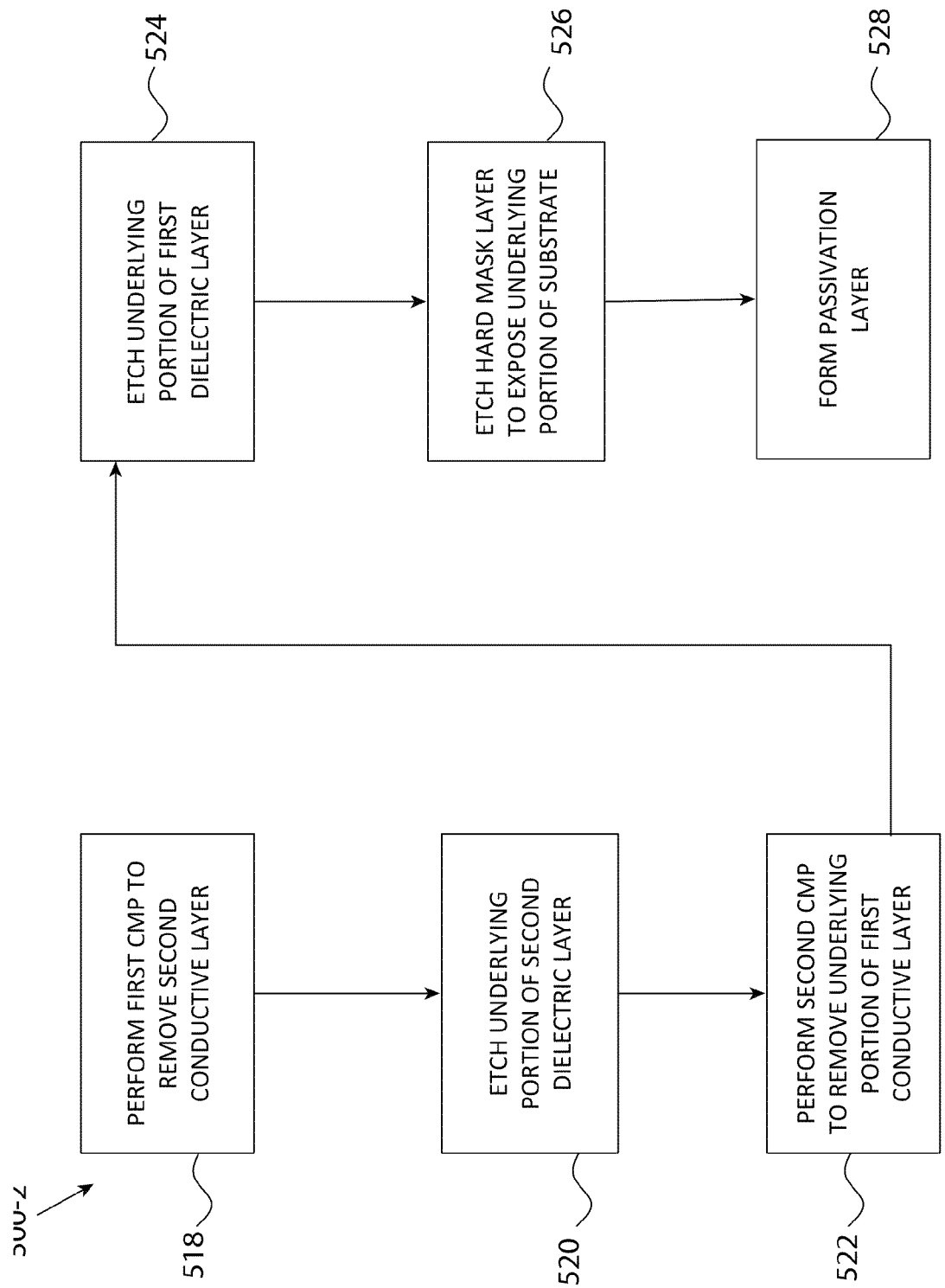

FIGS. 14 and 15 are flow charts illustrating an exemplary method 500 for forming a trench capacitor in accordance with some embodiments. The exemplary method comprises two groups of steps labeled as 500-1 and 500-2 in FIG. 14 and FIG. 15, respectively. The corresponding structures of a portion of a semiconductor device being fabricated are shown in FIGS. 1-10.

In step 502, a substrate 102 comprising a semiconductor material is provided. A hard mask layer 104 is disposed on or over substrate 102, as shown in FIG. 1. Examples of suitable materials for substrate 102 include but are not limited to silicon, germanium, a compound semiconductor, and a semiconductor-on-insulator (SOI) substrate. A compound semiconductor can be an III-V semiconductor compound such as gallium arsenide (GaAs). An SOI substrate can comprise a semiconductor on an insulator such as glass. Substrate 102 is p-doped in some embodiments, and is n-doped in some other embodiments. Examples of a suitable material for hard mask 104 include but are not limited to silicon oxide, silicon nitride (e.g., $Si_3N_4$), SiON, SiC, SiOC, or any combination thereof. In some embodiments, hard mask layer 104 comprises at least one of silicon oxide and silicon nitride. In some embodiments, hard mask layer 104 comprises silicon oxide.

Figure 2:
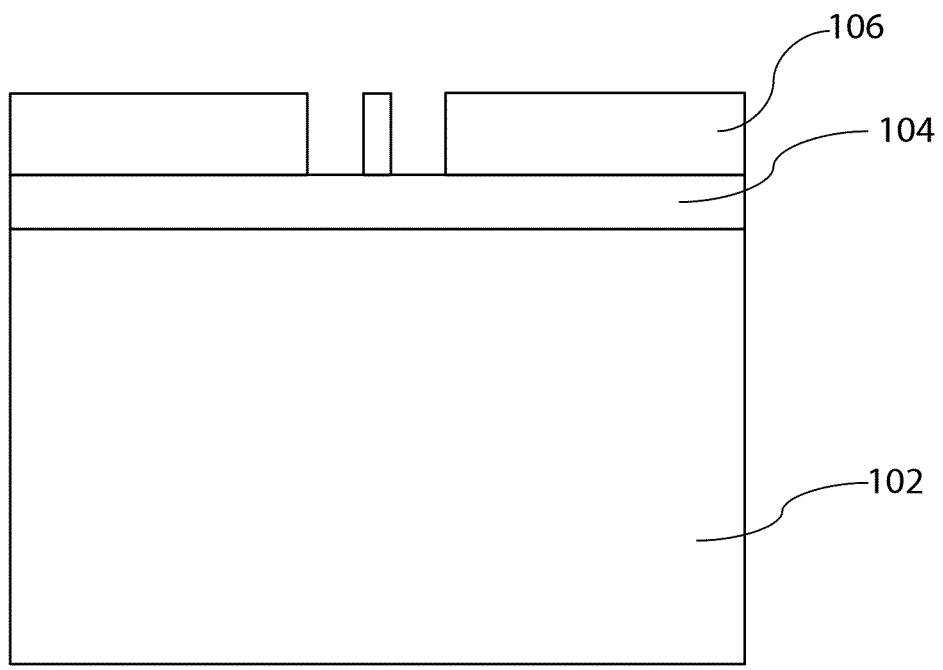
Figure 3:
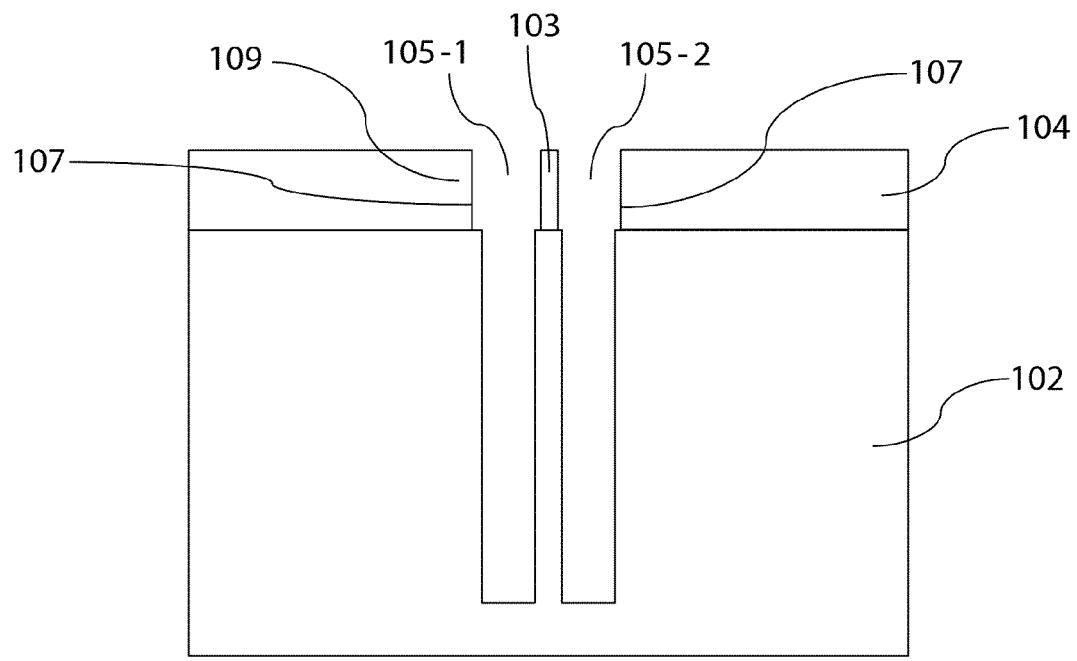

In step 504, hard mask layer 104 and substrate 102 are etched to form at least one trench 105 extending into substrate 102. Before the etching step, a photoresist layer 106 is applied in some embodiments, as shown in FIG. 2. Photoresist layer 106 can be patterned under a photo mask, and then etched to expose a portion of hard mask layer 104. The patterns for hard mask layer 104 can be also defined by using any other suitable processes. Hard mask layer 104 and substrate 102 are then etched to form a trench, as illustrated in FIG. 3. Hard mask layer 104 can be etched through a dry etching method such as plasma (e.g., fluorine containing plasma) etching, or a wet etching method, for example, using an acid solution. Photoresist layer 106 can then be stripped off. In some embodiments, The portion of the device can be cleaned after stripping off photoresist layer 106. Substrate 102 is etched using plasma in some embodiments. A cleaning step can follow after etching the substrate 102.

FIG. 3 is for the purpose of illustration only. Although FIG. 3 shows two trenches, the number of trenches 105 is not limited to any specific number. In some embodiments, hard mask layer 104 and substrate 102 are etched to form at least one trench. In some embodiments, hard mask layer 104 and substrate 102 are etched to form a trench structure comprising two trenches 105-1 and 105-2 extending into the substrate, wherein the two trenches 105-1 and 105-2 are separated by a middle portion 101 of substrate 102. A portion 103 of hard mask layer 104 is over the middle portion 101 of substrate 102.

Figure 4:
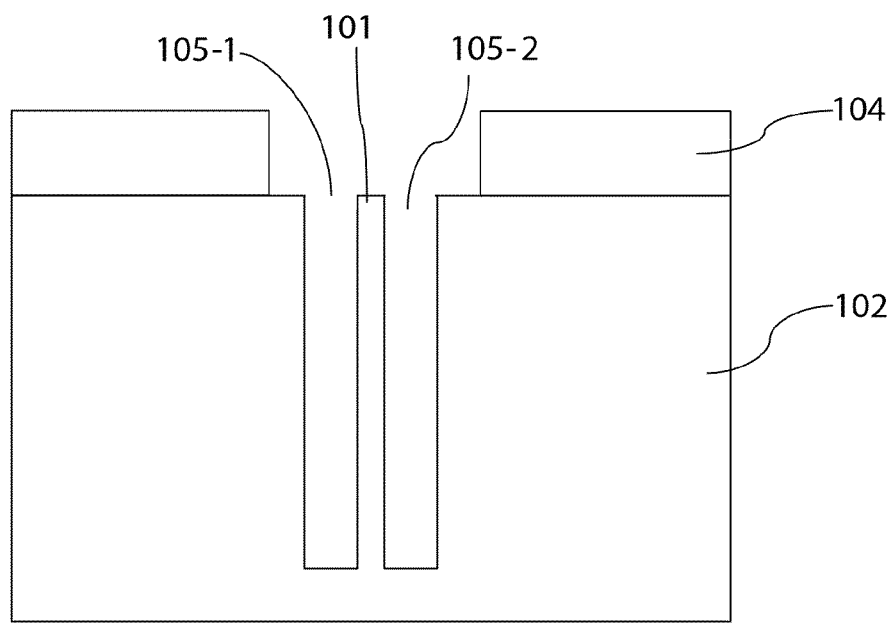

In step 506, a pull-back etching is performed on hard mask layer 104. In some embodiments, the pull-back etching is performed by dipping the portion of device into an acid solution, for example, a solution of HF in water at ratio of 1:50 by volume. The degree of etching can be controlled by dipping time. Through the pull-back etching, a portion of the hard mask layer 104 defining, and adjacent to, side walls 107 of an opening of the at least one trench 105 is removed. As illustrated in FIG. 4, a resulting opening on hard mask layer 104 has a width dimension larger than a width dimension of an opening of the at least one trench 105 extending into substrate 102.

In some embodiments, an overlap can exist between the etched portions of hard mask layer 104 defining and adjacent to side walls 107 of openings for the at least two trenches 105-1 and 105-2. For example, when the two trenches 105-1 and 105-2 are separated by a middle portion 101 of substrate 102, the pull-back etching is performed on hard mask layer 104 to remove a portion 109 of hard mask layer 104 defining and adjacent to side walls 107 of an opening of the two trenches 105-1 and 105-2. The portion 103 of hard mask layer 104 directly contacting the middle portion 101 of substrate 102 is removed, resulting in an opening on the hard mask layer 104 having a dimension larger than the dimension of openings of the two trenches extending into substrate 102. The resulting structure is illustrated in FIG. 4.

Figure 5:
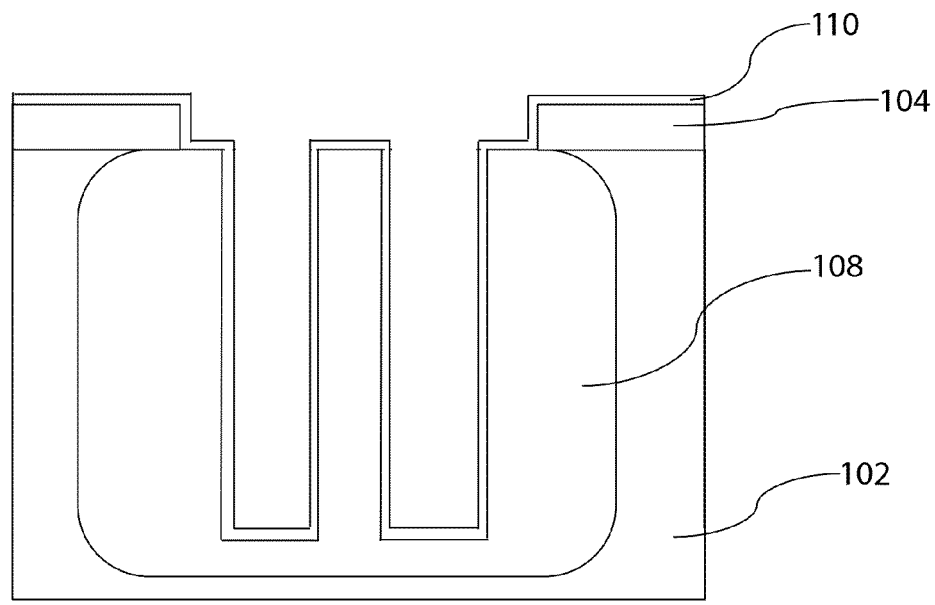

In step 508 of FIG. 14, in substrate 102, the semiconductor material defining upper surfaces and sidewalls of the at least one trench is doped to form a doped well region 108 (FIG. 5). Substrate 102 has a first conductivity type, and the doped well region 108 has a second conductivity type different from the first conductivity type in some embodiments. For example, in some embodiments, doped well region 108 is n-doped, and substrate 102 is p-doped. For example, $POCl_2$ can be introduced into the trench in some embodiments. The portion of the device can be dipped into a HF acid to remove possible residue of silicon dioxide formed during the doping process. In other embodiments, doped well region 108 is p-doped, and substrate 102 is n-doped. The doped well region 108 can be a region shared by one or more trenches in some embodiments. In some other embodiments, doped well region 108 comprises separate domains. Each doped domain or area is formed by doping the semiconductor material defining a side wall of a trench. The individual doped domains do not overlap with each other.

In step 510, a first dielectric layer 110 is deposited along the upper surfaces and the sidewalls of the at least one trench and hard mask layer 104. The structure of the portion of the semiconductor device is illustrated in FIG. 5 after step 508 and 510.

The first dielectric layer 110 can be formed by using chemical vapor deposition (CVD), high density plasma CVD, sputtering, or other suitable method. Examples of suitable materials for the first dielectric layer 110 include but are not limited to silicon oxide, silicon nitride (e.g., $Si_3N_4$), SiON, SiC, SiOC, or any combination thereof. The first dielectric layer 110 can be in one-layer or multiple-layer structure. In some embodiments, depositing the first dielectric layer 110 comprises: depositing an oxide layer; depositing a nitride layer; and depositing an oxide layer to form three-layer structure of oxide-nitride-oxide (ONO) materials. The oxide layer can be silicon oxide. The nitride layer can be silicon nitride. In some embodiments, depositing the first dielectric layer 110 comprises: depositing an oxide layer; and depositing a nitride layer to form two-layer structure of oxide-nitride (ON) materials. The oxide layer can be silicon oxide. The nitride layer can be silicon nitride.

In step 512, a first conductive layer 112 is formed over the first dielectric layer 110. Examples of a suitable material for the first conductive layer 112 include but are not limited to polysilicon, metals or any other suitable materials.

In step 514, a second dielectric layer 114 is deposited over the first conductive layer 112. The second dielectric layer 114 can be formed by using chemical vapor deposition (CVD), high density plasma CVD, sputtering, or other suitable method. Examples of suitable materials for the second dielectric layer 114 include but are not limited to silicon oxide, silicon nitride (e.g., $Si_3N_4$), SiON, SiC, SiOC, or any combination thereof. The second dielectric layer 114 can be in one-layer or multiple-layer structure. In some embodiments, as described for the first dielectric layer 110, depositing the second dielectric layer 114 comprises: depositing an oxide layer; depositing a nitride layer; and depositing an oxide layer to form three-layer structure of oxide-nitride-oxide (ONO) materials. In some embodiments, depositing the second dielectric layer 114 comprises: depositing an oxide layer; and depositing a nitride layer to form two-layer structure of oxide-nitride (ON) materials. The oxide layer can be silicon oxide. The nitride layer can be silicon nitride.

Figure 6:
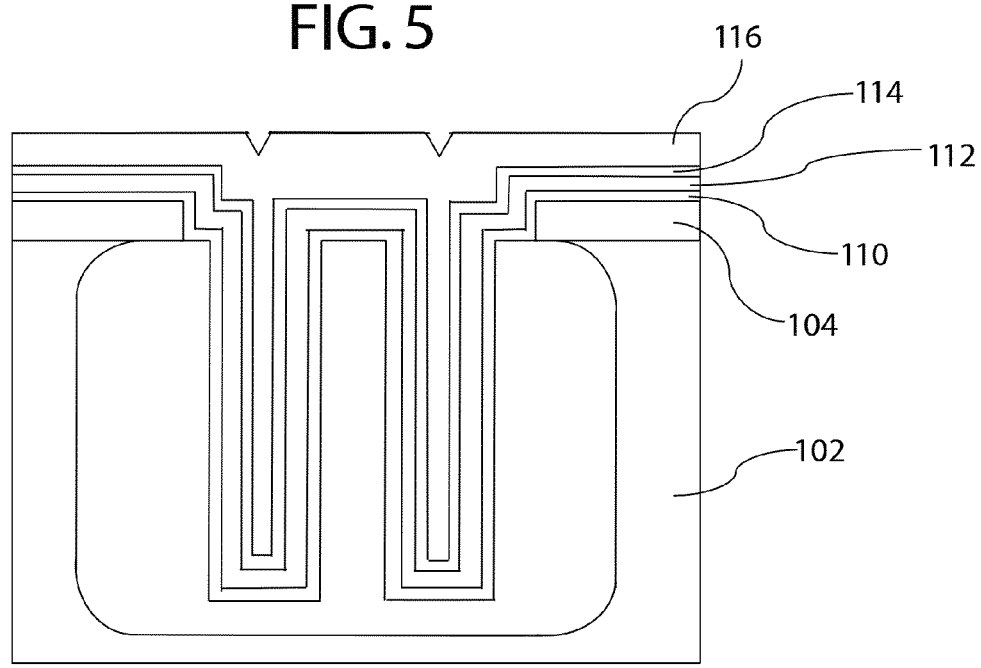

In step 516, a second conductive layer 116 is formed over the second dielectric layer 114. Example of a suitable material for the second conductive layer 116 include but are not limited to polysilicon, metals or any other suitable materials. In some embodiments, either the first conductive layer 112, or the second conductive layer 116 comprises can comprise polysilicon in some embodiments. In some embodiments, both the first conductive layer 112 and the second conductive layer 116 comprise polysilicon. The structure of the portion of the semiconductor device after steps 512, 514 and 516 is illustrated in FIG. 6.

Figure 7:
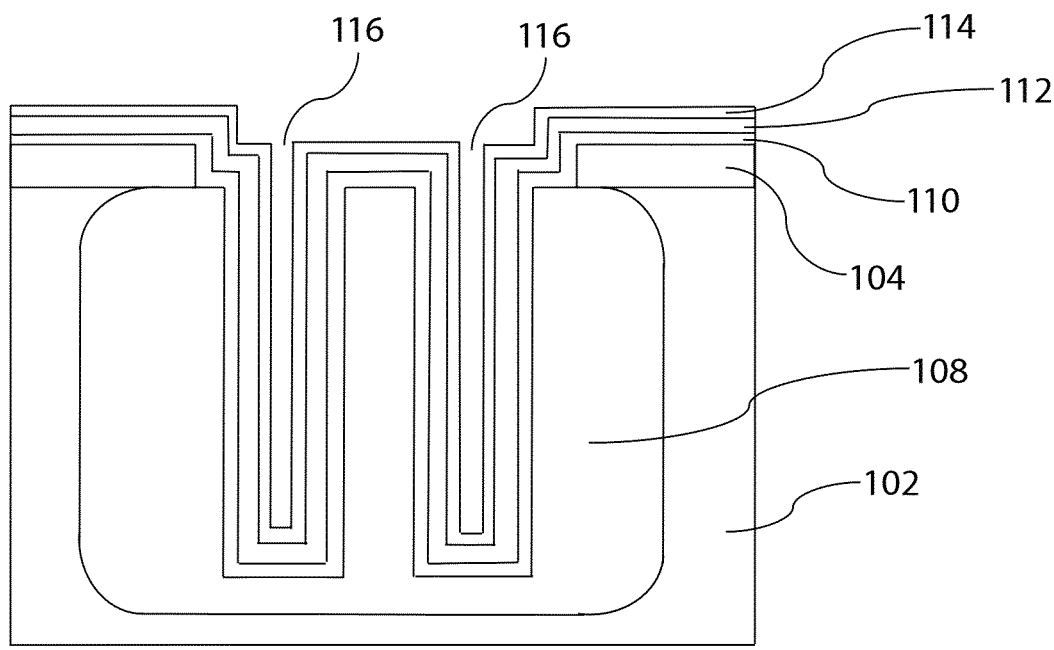

In step 518 of FIG. 15, a first chemical mechanical polishing (CMP) is performed to remove the second conductive layer 116 to expose an underlying portion of the second dielectric layer 114. The structure of the portion of the semiconductor device is illustrated in FIG. 7. In some embodiments, the second dielectric layer 114 comprising silicon nitride or silicon carbide functions as a contact etch stop layer (CESL) 114. The CMP can selectively remove other layers and stop at the CESL layer 114.

Figure 8:
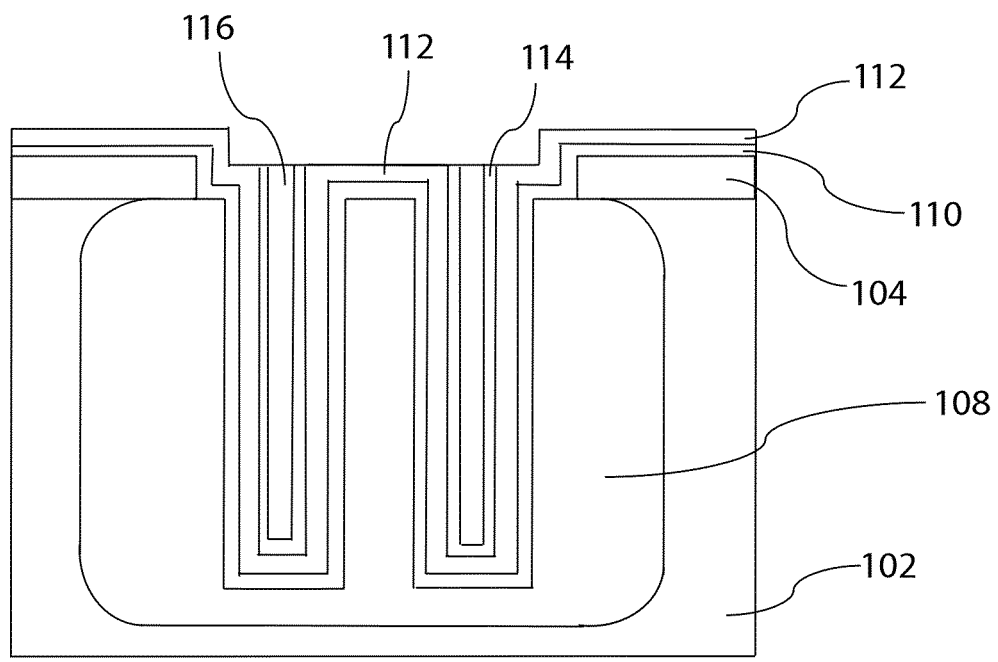

In step 520, the underlying portion of the second dielectric layer 114 is etched to expose an underlying portion of the first conductive layer 112. The structure of the portion of the semiconductor device after step 520 is illustrated in FIG. 8. The etching in step 520 can be performed using a dry etching method such as plasma etching in some embodiments. A fluorine containing plasma can be used in some embodiments.

In step 522, a second CMP is performed to remove the underlying portion of the first conductive layer 112 to expose an underlying portion of the first dielectric layer 110. In some embodiments, the first dielectric layer 110 comprising silicon nitride or silicon carbide functions as a contact etch stop layer (CESL). The CMP can selectively remove other layers and stop at the CESL layer 110.

Figure 9:
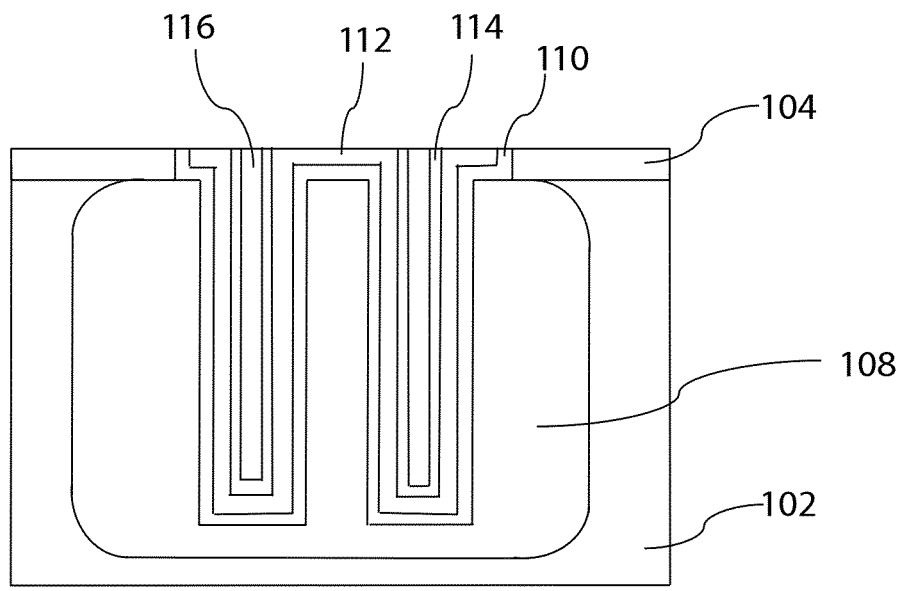

In step 524, the underlying portion of the first dielectric layer 110 is etched to expose the hard mask layer 104. The etching in step 524 can be performed using a dry etching method such as plasma etching in some embodiments. A fluorine containing plasma can be used in some embodiments. The structure of the portion of the semiconductor device after steps 522 and 524 is illustrated in FIG. 9.

In step 526, the hard mask layer 104 is etched to expose an underlying portion of substrate 102. Etching the hard mask layer 104 can be performed using a dry etching method such as plasma etching in some embodiments, or a wet etching method such as acid etching in some other embodiments.

In step 528, a passivation layer 118 is formed over exposed upper surfaces of the substrate 102, the first dielectric layer 110, the second dielectric layer 114, the first conductive layer 112, and the second conductive layer 116. Passivation layer 108 can be formed by oxidizing all the exposed surface of the portion of the device in some embodiments, or can be formed by depositing a thin layer of a passivation layer in some other embodiments. Examples of a suitable material for passivation layer 118 include but are not limited to silicon oxide. In some embodiments, passivation layer 118 directly contacts the upper surfaces of a portion of the substrate 102, the first dielectric layer 110, the second dielectric layer 114, the first conductive layer 112, and the second conductive layer 116. In some embodiments, the upper surfaces or edges of the substrate 102, the first dielectric layer 110, the second dielectric layer 114, the first conductive layer 112, and the second conductive layer 116 are coplanar. Passivation layer 118 is on such a coplanar surface.

When pull-back etching of hard mask layer 104 is used, steps 518-524 can be used without using any photoresist, in accordance with some embodiments. The resulting trench capacitor can be "self-aligned" without using any additional steps to define its pattern.

Figure 10:
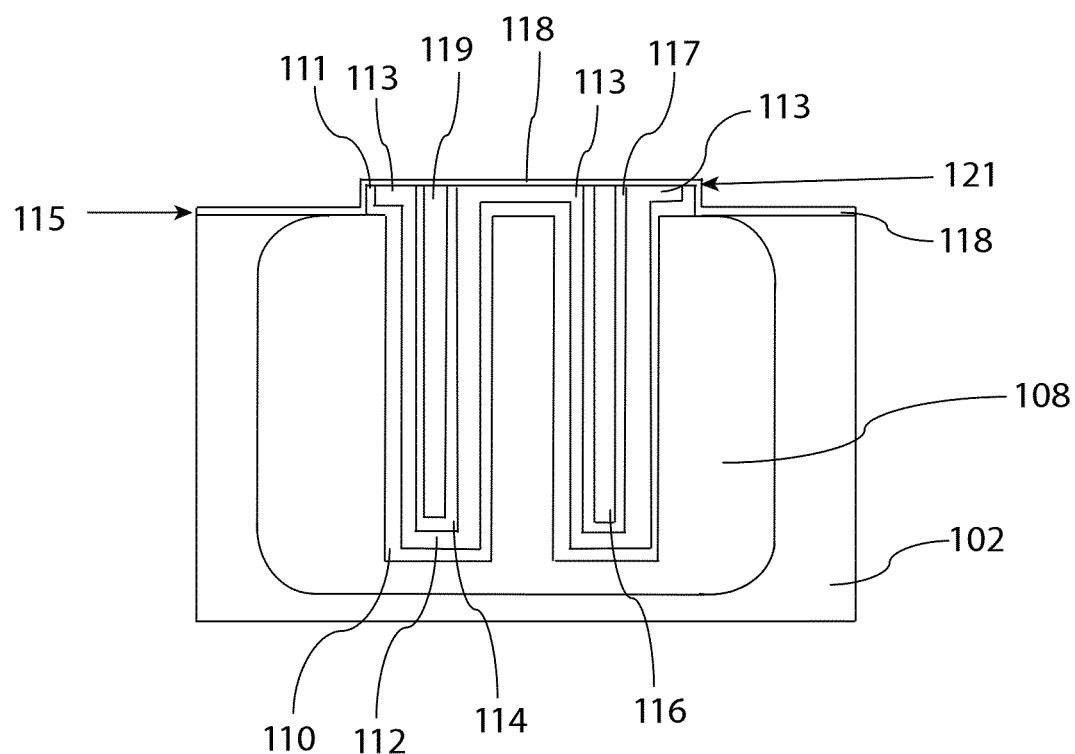
Figure 12:
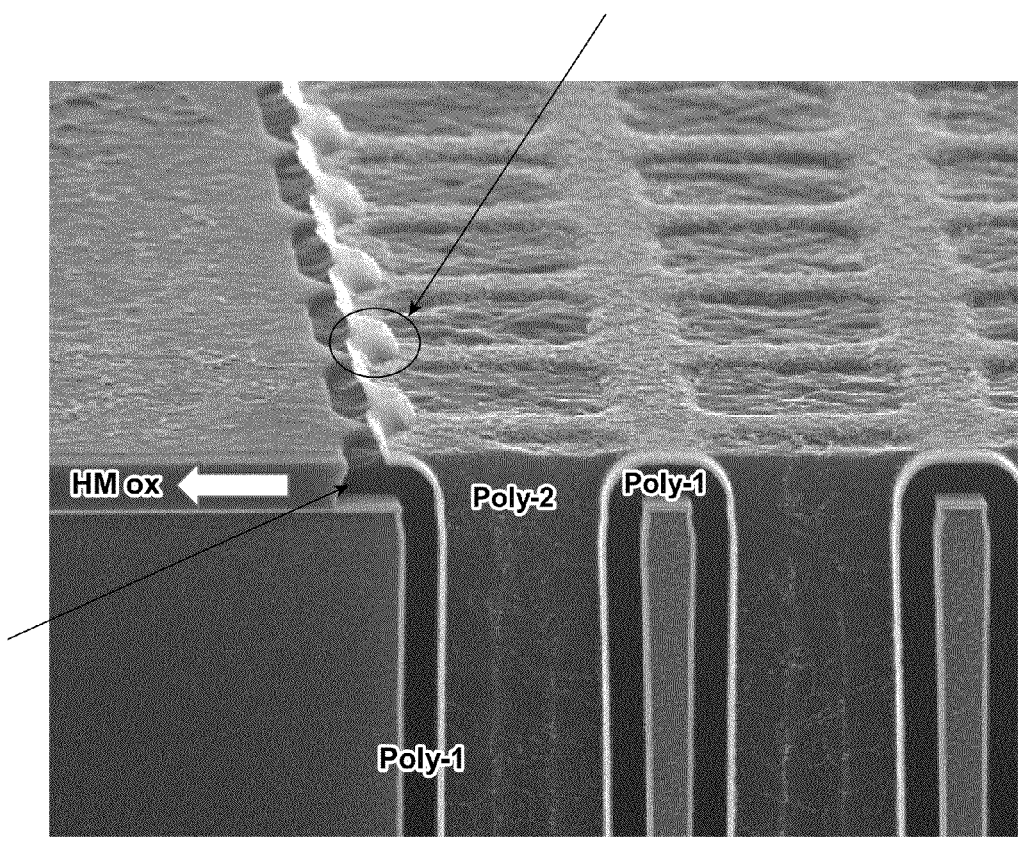
FIG. 12 is a scanning electronic microscopy (SEM) image illustrating the structure of an exemplary trench capacitor made by the method shown in FIGS. 1-10.
Figure 13:
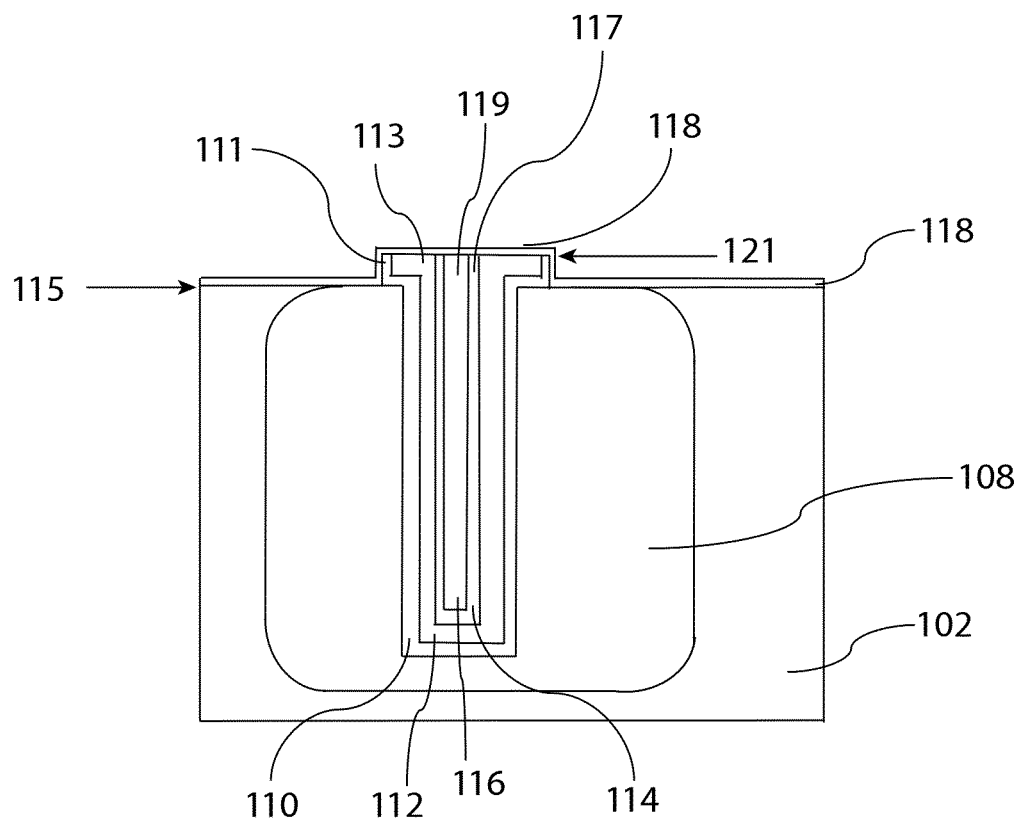
FIG. 13 illustrates an exemplary trench capacitor comprising at least one trench structure in accordance with some embodiments.

The structure of the portion of the semiconductor device having a trench capacitor after steps 526 and 528 is illustrated in FIG. 10. FIG. 12 is a scanning electronic microscopy (SEM) image illustrating the structure of such an exemplary trench capacitor made by the method described above. In FIG. 2, two trenches are shown for the purpose of illustration only. As a comparison, FIG. 13 illustrates an exemplary trench capacitor comprising one trench structure in accordance with some embodiments. In other embodiments, more than two trench capacitors are formed.

As shown in FIG. 10 and FIG. 13, a trench capacitor comprises a substrate 102 which comprises a semiconductor material. Substrate 102 has an upper surface of the semiconductor material and at least one trench extending into the substrate 102. The trench capacitor comprises a doped well region 108 adjacent to the at least one trench in substrate 102.

In the at least one trench, a first dielectric layer 110, and a second dielectric layer 114, and a first conductive layer 112 and a second conductive layer 116 are provided. The first dielectric layer 110 is disposed along sidewalls of the at least one trench and has a portion 111 extending above the upper surface 115 of the semiconductor material in substrate 102.

The first conductive layer 112 is disposed over the first dielectric layer 110 and has a portion 113 extending above the upper surface 115 of the semiconductor material in the substrate 102.

The second dielectric layer 114 is disposed over the first conductive layer 112 and has a portion 117 extending above and perpendicular to the upper surface 115 of the semiconductor material in substrate 102. The second conductive layer 116 is disposed over the second dielectric layer 114 and has a portion 119 extending above and perpendicular to the upper surface the semiconductor material in substrate 102.

In some embodiments, each of the first dielectric layer 110, the second dielectric layer 114, the first conductive layer 112 and the second conductive layer 116 has a respective upper edge 121. All the edges 121 are coplanar. In some embodiments, the trench capacitor further comprises a passivation layer 108 on the upper edges of the first dielectric layer 110, the second dielectric layer 114, the first conductive layer 112 and the second conductive layer 116.

Substrate 102 has a first conductivity type, and the doped well region 108 has a second conductivity type different from the first conductivity type. For example, substrate 102 is n-doped and doped well region 108 is p-doped in some embodiments. Substrate 102 is p-doped and doped well region 108 is n-doped in other embodiments. The first dielectric layer 110 and the second dielectric layer 114 comprise a three-layer structure of oxide-nitride-oxide (ONO) materials in some embodiments. The first dielectric layer has a portion 111 extending above and perpendicular to the upper surface 115 of the semiconductor material in the substrate 102.

Figure 11:
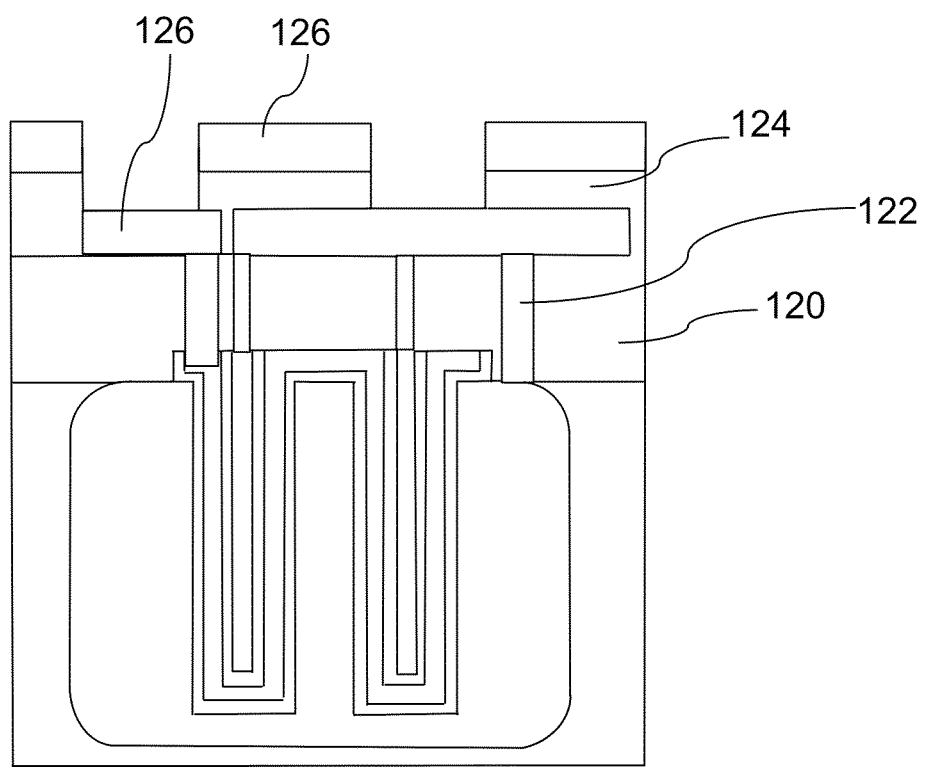
FIG. 11 illustrates a semiconductor device comprising a trench capacitor of FIG. 10 in some embodiments.

FIG. 11 illustrates a semiconductor device comprising a trench capacitor of FIG. 10 in some embodiments. Further processing steps can be performed starting from the exemplary trench capacitor of FIG. 10 to make a semiconductor device. For example, an interconnect structure comprising one or more interlayer dielectric (ILD) layer 120 can be deposited over the trench capacitor of FIG. 10. Conductor connections 122 can be formed through steps including polishing the surface of ILD layer 120 using a CMP process, patterning using a photoresist and a photomask, etching ILD layer 120, and depositing a conductive material such as tungsten and/or TiN to form contacts 122. Metal contacts 126 can be also formed over ILD layer 120 and conductor connections 122 in some embodiments. Metal contacts 126 can be also patterned and etched for depositing additional dielectric layer, which can include a first layer 124 comprising high density oxide 124, and a second layer 126 comprising silicon nitride in some embodiments.

The present disclosure provides a method for forming a trench capacitor, and a trench capacitor of a semiconductor device. The method for forming a trench capacitor such as deep trench capacitor comprises providing a substrate comprising a semiconductor material and having thereon a hard mask layer; etching the hard mask layer and the substrate to form at least one trench extending into the substrate; and performing pull-back etching on the hard mask layer. Through the pull-back etching, a portion of the hard mask layer defining and adjacent to side walls of an opening of the at least one trench is removed. A resulting opening on the hard mask layer has a width dimension larger than a width dimension of an opening of the at least one trench extending into the substrate. The method further comprises doping the semiconductor material defining upper surfaces and sidewalls of the at least one trench to form a doped well region.

In some embodiments, the hard mask layer comprises at least one of silicon oxide and silicon nitride. In some embodiments, the pull-back etching on the hard mask layer is performed by dipping the substrate having the hard mask layer thereon into an acid solution. In some embodiments, the hard mask layer and the substrate are etched to form a trench structure comprising two trenches extending into the substrate, wherein the two trenches are separated by a middle portion of the substrate. The pull-back etching is performed on the hard mask layer to remove the hard mask layer defining and adjacent to side walls of an opening of the two trenches, and remove the hard mask layer directly contacting the middle portion of the substrate, resulting in an opening on the hard mask layer having a dimension larger than the dimension of openings of the two trenches extending into the substrate.

In some embodiments, the method further comprises depositing a first dielectric layer along the upper surfaces and the sidewalls of the at least one trench, and the hard mask layer; forming a first conductive layer over the first dielectric layer; depositing a second dielectric layer over the first conductive layer; and forming a second conductive layer over the second dielectric layer. Either the first conductive layer or the second conductive layer comprises polysilicon in some embodiments.

In some embodiments, depositing the first dielectric layer comprises: depositing an oxide layer; depositing a nitride layer; and depositing an oxide layer to form three-layer structure of oxide-nitride-oxide (ONO) materials. Similarly, in some embodiments, depositing the second dielectric layer comprises: depositing an oxide layer; depositing a nitride layer; and depositing an oxide layer to form three-layer ONO structure. The substrate has a first conductivity type, and the doped well region has a second conductivity type different from the first conductivity type in some embodiments.

The method can further comprises performing a first CMP to remove the second conductive layer to expose an underlying portion of the second dielectric layer; etching the underlying portion of the second dielectric layer to expose an underlying portion of the first conductive layer; performing a second CMP to remove the underlying portion of the first conductive layer to expose an underlying portion of the first dielectric layer; and etching the underlying portion of the first dielectric layer to expose the hard mask layer. The method for forming a trench capacitor can further comprises etching the hard mask layer to expose an underlying portion of the substrate; and forming a passivation layer over exposed upper surfaces of the substrate, the first and the second dielectric layer, and the first and the second conductive layer.

The present disclosure also provides a trench capacitor of a semiconductor device. Such a trench capacitor comprises a substrate comprising a semiconductor material. The substrate has an upper surface of the semiconductor material and at least one trench extending into the substrate. The trench also comprises a doped well region adjacent to the at least one trench in the substrate. The at least one trench comprises a first and a second dielectric layer, and a first and a second conductive layer. The first dielectric layer is disposed along sidewalls of the at least one trench and has a portion extending above the upper surface of the semiconductor material in the substrate. The first conductive layer is disposed over the first dielectric layer and has a portion extending above the upper surface of the semiconductor material in the substrate. The second dielectric layer is disposed over the first conductive layer and has a portion extending above and perpendicular to the upper surface of the semiconductor material in the substrate. The second conductive layer is disposed over the second dielectric layer and has a portion extending above and perpendicular to the upper surface the semiconductor material in the substrate. In some embodiments, each of the first dielectric layer, the second dielectric layer, the first conductive layer and the second conductive layer has a respective upper edge. All the edges are coplanar. In some embodiments, the trench capacitor further comprises a passivation layer on the upper edges of the first dielectric layer, the second dielectric layer, the first conductive layer and the second conductive layer. The substrate has a first conductivity type, and the doped well region has a second conductivity type different from the first conductivity type. The first dielectric layer and the second dielectric layer comprise a three-layer structure of ONO materials in some embodiments. The first dielectric layer has a portion extending above and perpendicular to the upper surface of the semiconductor material in the substrate.

Although the subject matter has been described in terms of exemplary embodiments, it is not limited thereto. Rather, the appended claims should be construed broadly, to include other variants and embodiments, which may be made by those skilled in the art.

What is claimed is:

1. A method for forming a trench capacitor, comprising:
   providing a substrate comprising a semiconductor material of a first conductivity type and having thereon a hard mask layer;
   etching the hard mask layer and the substrate to form at least one trench extending into the substrate;
   performing pull-back etching on the hard mask layer to remove a portion of the hard mask layer defining and adjacent to side walls of an opening of the at least one trench, resulting in an opening on the hard mask layer having a width dimension larger than a width dimension of an opening of the at least one trench extending into the substrate; and
   doping the semiconductor material defining upper surfaces and sidewalls of the at least one trench to form a doped well region comprising a semiconductor material of a second conductivity type, wherein the second conductivity type is different from the first conductivity type.

2. The method of claim 1, wherein the hard mask layer comprises at least one of silicon oxide and silicon nitride.

3. The method of claim 1, wherein the pull-back etching on the hard mask layer is performed by dipping the substrate having the hard mask layer thereon into an acid solution.

4. The method of claim 1, wherein
   the hard mask layer and the substrate are etched to form a trench structure comprising two trenches extending into the substrate, wherein the two trenches are separated by a middle portion of the substrate; and
   the pull-back etching is performed on the hard mask layer to remove the hard mask layer defining and adjacent to side walls of an opening of the two trenches, and remove the hard mask layer directly contacting the middle portion of the substrate, resulting in an opening on the hard mask layer having a dimension larger than the dimension of openings of the two trenches extending into the substrate.

5. The method of claim 1, further comprising:
   depositing a first dielectric layer along the upper surfaces and the sidewalls of the at least one trench, and the hard mask layer;
   forming a first conductive layer over the first dielectric layer;
   depositing a second dielectric layer over the first conductive layer; and
   forming a second conductive layer over the second dielectric layer.

6. The method of claim 5, wherein the first conductive layer and the second conductive layer comprise polysilicon.

7. The method of claim 5, wherein depositing the first dielectric layer comprises:
depositing an oxide layer;
depositing a nitride layer; and
depositing an oxide layer to form three-layer structure of oxide-nitride-oxide (ONO) materials.

8. The method of claim 5, wherein depositing the second dielectric layer comprises:
depositing an oxide layer;
depositing a nitride layer; and
depositing an oxide layer to form three-layer structure of oxide-nitride-oxide (ONO) materials.

9. The method of claim 5, further comprising:
performing a first chemical mechanical polishing (CMP) to remove the second conductive layer to expose an underlying portion of the second dielectric layer;
etching the underlying portion of the second dielectric layer to expose an underlying portion of the first conductive layer;
performing a second CMP to remove the underlying portion of the first conductive layer to expose an underlying portion of the first dielectric layer; and
etching the underlying portion of the first dielectric layer to expose the hard mask layer.

10. The method of claim 9, further comprising:
etching the hard mask layer to expose an underlying portion of the substrate; and
forming a passivation layer over exposed upper surfaces of the substrate, the first and the second dielectric layer, and the first and the second conductive layer, the passivation layer directly contacting the upper surfaces of a portion of the substrate, the first dielectric layer, the second dielectric layer, the first conductive layer, and the second conductive layer.

11. A method for forming a trench capacitor, comprising:
providing a substrate comprising a semiconductor material of a first conductivity type and having thereon a hard mask layer;
etching the hard mask layer and the substrate to form at least one trench extending into the substrate;
performing pull-back etching on the hard mask layer to remove a portion of the hard mask layer defining and adjacent to side walls of an opening of the at least one trench, resulting in an opening on the hard mask layer having a width dimension larger than a width dimension of an opening of the at least one trench extending into the substrate;
doping the semiconductor material defining upper surfaces and sidewalls of the at least one trench to form a doped well region comprising a semiconductor material of a second conductivity type, wherein the second conductivity type is different from the first conductivity type;
depositing a first dielectric layer along the upper surfaces and the sidewalls of the two trenches, and the hard mask layer;
forming a first conductive layer over the first dielectric layer;
depositing a second dielectric layer over the first conductive layer; and
forming a second conductive layer over the second dielectric layer.

12. The method of claim 11, wherein:
the first conductive layer and the second dielectric layer comprise polysilicon; and
the first dielectric layer and the second dielectric layer comprise a three-layer structure of oxide-nitride-oxide (ONO) materials.

13. The method of claim 11, further comprising:
performing a first chemical mechanical polishing (CMP) to remove the second conductive layer to expose an underlying portion of the second dielectric layer;
etching the underlying portion of the second dielectric layer to expose an underlying portion of the first conductive layer;
performing a second CMP to remove the underlying portion of the first conductive layer to expose an underlying portion of the first dielectric layer;
etching the underlying portion of the first dielectric layer to expose the hard mask layer;
etching the hard mask layer to expose an underlying portion of the substrate; and
forming a passivation layer over exposed upper surfaces of the substrate, the first and the second dielectric layer, and the first and the second conductive layer.

14. A trench capacitor of a semiconductor device, comprising:
a substrate comprising a semiconductor material of a first conductivity type, the substrate having an upper surface of the semiconductor material and at least one trench extending into the substrate;
a doped well region adjacent to the at least one trench in the substrate. the doped well region comprising a semiconductor material of a second conductivity type, wherein the second conductivity type is different from the first conductivity type;
wherein the at least one trench comprises:
a first dielectric layer disposed along sidewalls of the at least one trench and having a portion extending above the upper surface of the semiconductor material in the substrate;
a first conductive layer disposed over the first dielectric layer and having a portion extending above the upper surface of the semiconductor material in the substrate;
a second dielectric layer disposed over the first conductive layer and having a portion extending above and perpendicular to the upper surface of the semiconductor material in the substrate; and
a second conductive layer disposed over the second dielectric layer and having a portion extending above and perpendicular to the upper surface the semiconductor material in the substrate.

15. The trench capacitor of claim 14, wherein the first dielectric layer and the second dielectric layer comprise a three-layer structure of oxide-nitride-oxide (ONO) materials.

16. The trench capacitor of claim 14, wherein the first dielectric layer has a portion extending above and perpendicular to the upper surface of the semiconductor material in the substrate.

17. The trench capacitor of claim 14, wherein:
each of the first dielectric layer, the second dielectric layer, the first conductive layer and the second conductive layer has a respective upper edge, the upper edges being coplanar.

18. The trench capacitor of claim 17, further comprising
a passivation layer on the upper edges of the first dielectric layer, the second dielectric layer, the first conductive layer and the second conductive layer.

* * * * *